(12) United States Patent
Schie et al.

(10) Patent No.: US 11,494,628 B2
(45) Date of Patent: Nov. 8, 2022

(54) CHARGE DOMAIN MATHEMATICAL ENGINE AND METHOD

(71) Applicants: David Schie, San Jose, CA (US); Sergey Gaitukevich, Stallhofen (AT); Peter Drabos, Graz (AT); Andreas Sibrai, Soeding-Sankt Johann (AT); Erik Sibrai, Soeding-Sankt Johann (AT)

(72) Inventors: David Schie, San Jose, CA (US); Sergey Gaitukevich, Stallhofen (AT); Peter Drabos, Graz (AT); Andreas Sibrai, Soeding-Sankt Johann (AT); Erik Sibrai, Soeding-Sankt Johann (AT)

(73) Assignee: AISTORM, INC., Houston, TX (US)

( * ) Notice: Subject to any disclaimer, the term of this patent is extended or adjusted under 35 U.S.C. 154(b) by 814 days.

(21) Appl. No.: 16/291,864

(22) Filed: Mar. 4, 2019

(65) Prior Publication Data

US 2019/0286977 A1   Sep. 19, 2019

Related U.S. Application Data

(60) Provisional application No. 62/637,496, filed on Mar. 2, 2018.

(51) Int. Cl.
*H03K 3/00* (2006.01)
*G06N 3/063* (2006.01)
(Continued)

(52) U.S. Cl.
CPC ............ *G06N 3/0635* (2013.01); *G11C 11/54* (2013.01); *G11C 19/0883* (2013.01);
(Continued)

(58) Field of Classification Search
None
See application file for complete search history.

(56) References Cited

U.S. PATENT DOCUMENTS 4,723,114 A * 2/1988 D'Arrigo ............. H03K 3/0231
                                                    331/111
5,070,311 A * 12/1991 Nicolai ................ H03K 3/0231
                                                    331/111
(Continued)

OTHER PUBLICATIONS

Digital Circuit Design Challenges and Opportunities in the Era of Nanoscale CMOS Feb. 2008 https://www.d.umn.edu/~htang/ece4311_doc_F11/04403891.pdf.

*Primary Examiner* — Tuan T Lam
(74) *Attorney, Agent, or Firm* — Weiss & Moy, P.C.; Jeffrey D. Moy (57) ABSTRACT

A multiplier has a pair of charge reservoirs. The pair of charge reservoirs are connected in series. A first charge movement device induces charge movement to or from the pair of charge reservoirs at a same rate. A second charge movement device induces charge movement to or from one of the pair of reservoirs, the rate of charge movement programmed to one of add or remove charges at a rate proportional to the first charge movement device. The first charge movement device loads a first charge into a first of the pair of charge reservoirs during a first cycle. The first charge movement device and the second charge movement device remove charges at a proportional rate from the pair of charge reservoirs during a second cycle until the first of the pair of charge reservoirs is depleted of the first charge. The second charge reservoir thereafter holding the multiplied result.

3 Claims, 12 Drawing Sheets

(51) Int. Cl.
*G11C 11/54* (2006.01)
*G11C 19/08* (2006.01)
*H01L 29/423* (2006.01)
*H01L 29/792* (2006.01)
*H03K 3/02* (2006.01)
*H03K 23/00* (2006.01)
*G06G 7/19* (2006.01)

(52) U.S. Cl.
CPC ...... *H01L 29/42328* (2013.01); *H01L 29/792* (2013.01); *H03K 3/02* (2013.01); *H03K 23/00* (2013.01); *G06G 7/1907* (2013.01)

(56) References Cited

U.S. PATENT DOCUMENTS

| | | | | |
|---|---|---|---|---|
| 5,444,411 A | * | 8/1995 | Yang | G06G 7/14 327/566 |
| 5,453,711 A | * | 9/1995 | Yamamoto | G06G 7/14 327/407 |
| 5,465,064 A | * | 11/1995 | Shou | G06G 7/14 327/407 |
| 5,532,580 A | * | 7/1996 | Shu | G06G 7/14 323/354 |
| 5,708,385 A | * | 1/1998 | Shou | G06G 7/14 327/334 |
| 5,815,021 A | * | 9/1998 | Shou | G06J 1/00 327/356 |
| 6,611,164 B2 | * | 8/2003 | Uno | G06G 7/14 327/355 |
| 8,310,319 B2 | * | 11/2012 | Liu | H03K 7/08 332/110 |
| 8,963,589 B1 | * | 2/2015 | Ferrario | H03K 4/50 327/134 |
| 9,748,935 B2 | * | 8/2017 | Kim | H03K 5/00 |
| 2002/0026469 A1 | * | 2/2002 | Bugeja | G06G 7/14 708/805 |
| 2005/0231398 A1 | * | 10/2005 | Ravinuthula | G06G 7/18 341/50 |
| 2007/0127469 A1 | | 6/2007 | Rashid et al. | |
| 2009/0080309 A1 | * | 3/2009 | Nishikawa | G06G 7/14 |
| 2009/0237140 A1 | * | 9/2009 | Pae | G06G 7/14 327/361 |
| 2012/0032748 A1 | * | 2/2012 | Li | H03K 5/1252 327/170 |
| 2014/0191791 A1 | * | 7/2014 | Ohnuki | G06F 7/501 327/361 |
| 2014/0344200 A1 | | 11/2014 | Schie | |
| 2014/0361356 A1 | * | 12/2014 | Yu | H01L 31/0232 257/292 |
| 2016/0182077 A1 | | 6/2016 | Maddox et al. | |
| 2018/0091129 A1 | * | 3/2018 | Rostaing | H03K 3/3565 |
| 2019/0272395 A1 | * | 9/2019 | Schie | G06N 3/02 |
| 2019/0332459 A1 | * | 10/2019 | Schie | G06N 3/084 |
| 2019/0332929 A1 | * | 10/2019 | Schie | G06N 3/0481 |
| 2020/0110987 A1 | * | 4/2020 | Schie | G06N 3/0635 |

* cited by examiner

CHARGE DOMAIN MATHEMATICAL ENGINE AND METHOD

RELATED APPLICATIONS

This patent application is related to U.S. Provisional Application No. 62/637,496 filed Mar. 2, 2018, entitled "CHARGE DOMAIN MATHEMATICAL ENGINE" in the name of David Schie, and which is incorporated herein by reference in its entirety. The present patent application claims the benefit under 35 U.S.C § 119(e).

TECHNICAL FIELD

The present invention generally relates to image sensing device and, more particularly to, a charge domain mathematical engine wherein a charge store in a reservoir may be directly coupled to a multiplier of a machine learning input layer.

BACKGROUND

Figure 1:
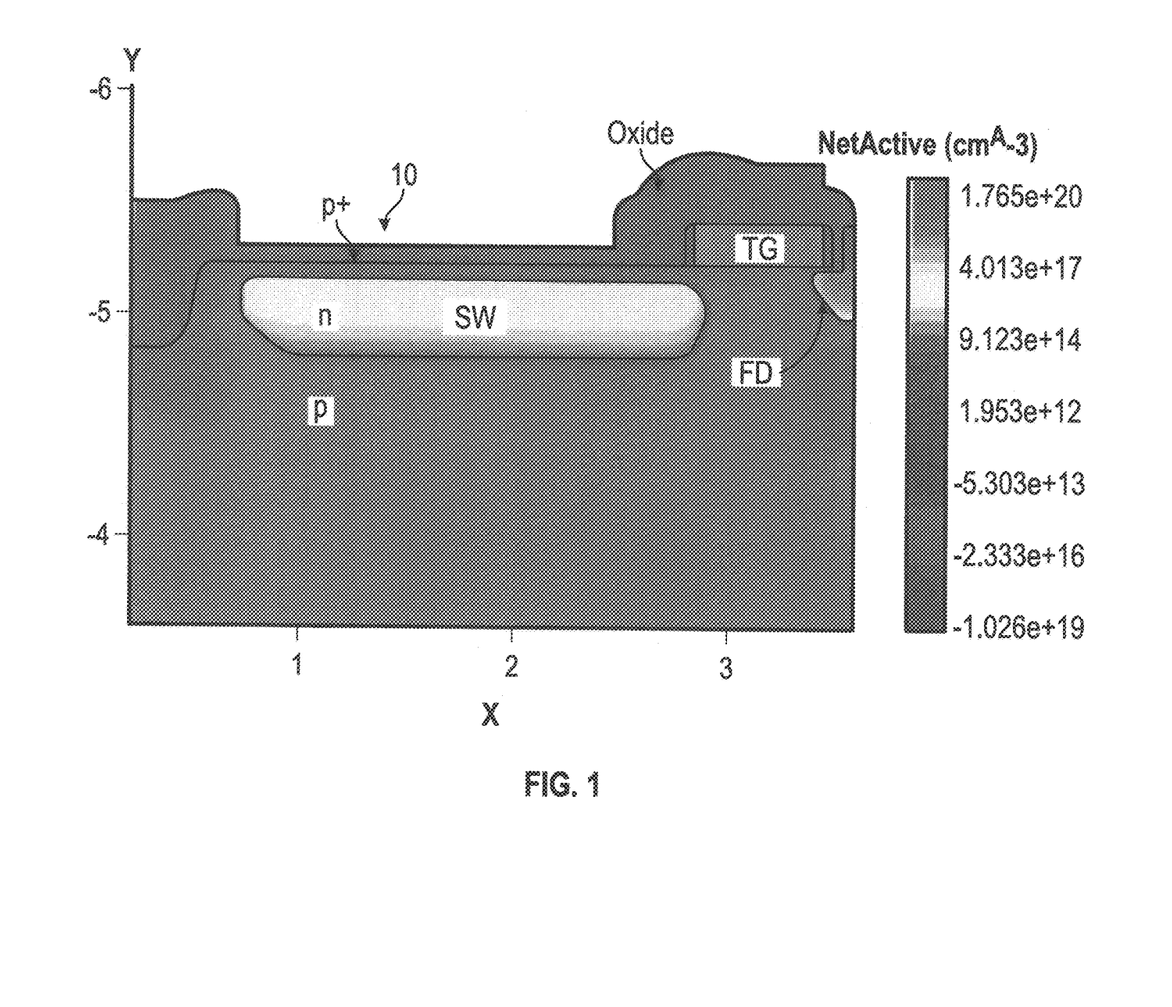
FIG. 1 shows a cross-sectional view of a buried pin diode structure showing active doping profiles.

In silicon imaging it is common to rely on the integration or movement of charge using charge domain structures such as spill and fill circuits, CCD registers, photodetectors, correlated double sampling circuits, and similar devices. Spill and fill circuits may rely upon the concept of a buried pinned photodiode, FIG. 1 shows a cross-section view of a buried pin diode structure 10 showing active doping profiles. The buried pinned photodiode 10 may integrate electrons created when light is collected by the buried pinned photodiode 10 into a storage well SW region. A second charge reservoir, the floating diffusion FD, is created on the far side of a transfer gate labelled TG.

Figure 2A:
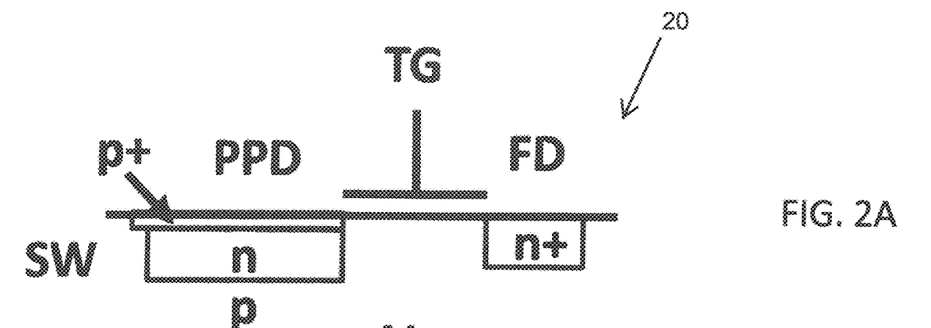
FIG. 2A shows a spill and fill circuit.
Figure 2B:
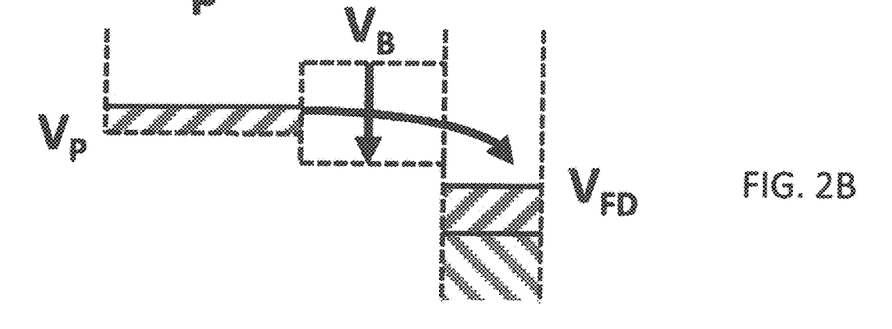
FIG. 2B shows an energy diagram from a storage well SW charge reservoir into a floating diffusion FD charge reservoir for the spill and fill circuit of FIG. 2A.

Referring to FIG. 2A, a spill and fill circuit 20 may be seen. The spill and fill circuit 20 uses the concept of a pinned photodiode (PPD) charge receptacle holding electrons in front of a transfer gate TG. The transfer gate TG is lowered and raised in conformance with required electron flow. At some point the transfer gate TG lowers the potential barrier and the electrons spill from the storage well SW charge reservoir into the floating diffusion FD charge reservoir. The devices are created so as to ensure that all electrons move from the storage well SW charge reservoir into the floating diffusion FD charge reservoir. FIG. 2B shows the energy diagram from the storage well SW charge reservoir into the floating diffusion FD charge reservoir.

Figure 3:
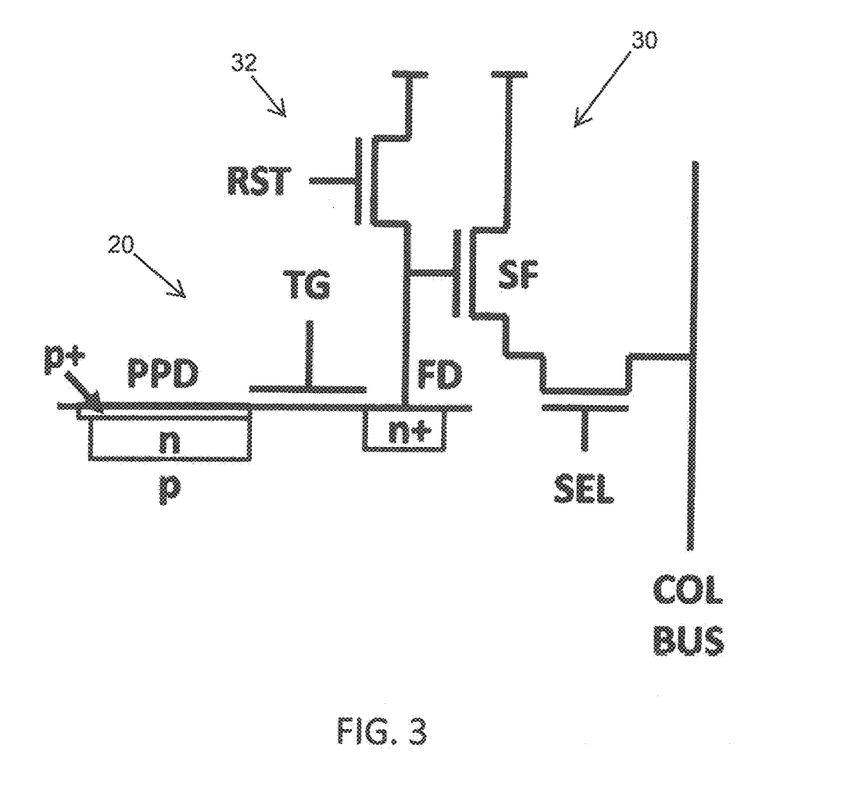
FIG. 3 shows the spill and fill circuit of FIG. 2A further coupled to a reset mechanism (RST) and to a source follower (SF) for reading out the voltage of the floating diffusion (FD) through a select line (SEL) to a bus (COL BUS).

Referring to FIG. 3, a spill and fill circuit 30 may be seen. The fill and spill circuit 30 uses the uses the spill and fill circuit 20 of FIG. 2A but includes the concept of a reset device 32 coupled to the transfer gate TG and a source follower SF which converts the charge on the floating diffusion FD charge reservoir to a voltage which may then be read by other circuitry. Typically, correlated double sampling (CDS) may be used to sample the noise and offset on the output of the floating diffusion PD charge reservoir after reset, and then read again after the spill (charge transfer) such that only the difference attributed to the latest integrated charge stored on the storage well SW remains. By doing this any offset charge and certain noise is removed.

Instead of two charge reservoirs a single charge reservoir might, be used to produce a weighted input and sum result or a weighted summer. Initially said reservoir would be reset to a known charge level. Thereafter during a first cycle a plurality of input current movement means would couple charge from the charge reservoir with each of said current movement means removing charge at a rate individually proportional (in conformance with desired weight values) to an output current movement means to be used in a second cycle but off during said first cycle. Additionally, each of said plurality of input current movement means would be further gated in time, or allowed to move charge only during a time, conforming to individual input magnitudes. The resulting input charge movement magnitude for a gated period of time would remove a charge conforming to the weighted input magnitude from said charge reservoir. At the end of first cycle, once all input movement means have removed their charges, a second cycle would cause the output charge movement means to return the charge in the charge reservoir to its original level. The time it would take to do so would be proportional to the weighted sum of the inputs. The resulting weighted summer thereby accepting inputs as time, weights are charge movement rate magnitude, and producing an output as a time.

Once the charge is transferred to the floating diffusion FD charge reservoir there are a number of other circuits which may be used in place of the source follower SF to convert the charge into a voltage or current and thereafter into a digital value. For example, a row of an imager may rely on a counter which is compared to each pixel follower value and the digital words associated with each specific pixel recorded. There are many circuits which attempt to optimize the speed and power efficiency of the conversion from the charge domain to a digital word.

Machine vision is a common application of artificial intelligence (AI) or machine learning. Autonomous or machine vision augmented vehicles, handset security such as fingerprints or facial recognition, smart city sensors, security cameras, x-ray, ultrasound and medical diagnosis, robotics, drones, wearable heart rate monitors, behavioral analysis and monitoring and many other applications are relying upon the analysis of images for a variety of tasks, many of them time and power critical.

Presently, machine learning systems require that the input be a digital word or at the very least a voltage, current or spiking waveform (which is also a voltage or current waveform). The conversion of charge relies upon a coupling circuit such as the source follower SF shown in FIG. 3 all of which are known to be associated with three undesirable side effects. The first is a loss of image quality due to introduction of noise by the coupling circuit. It is well known by those skilled in the art that any circuit which converts charges maintained in reservoirs such as the storage well SW or floating diffusion FD regions described in FIGS. 1-3 to a voltage or current will necessarily introduce noise. This noise for example could degrade an image with 14 bit pixel accuracy to 12 bit equivalent accuracy. In medical or time critical life safety applications this could obscure key information. A second side effect of conversion to the current or voltage domain is the time associated with the conversion. The digitization of the voltage or current on the output of the coupling circuit takes time. In an augmented vehicle, life safety application or high-speed imaging application this latency could literally mean the difference between a desirable result or a very undesirable result such as a death or fatality. Finally, the conversion of the information from the charge domain to the voltage or current domain and finally digital domain further requires additional energy. This energy is associated with the coupling circuit itself, as well, as the circuitry related to digitization or creating the desired waveforms such as a neuromorphic spiking waveform.

Therefore, it would be desirable to provide a system and method that overcome the above problems. The system and, method would couple the charge stored in reservoirs directly to multipliers of a machine learning input layer or weighted summer.

SUMMARY

In accordance with one embodiment, a multiplier is disclosed. The multiplier has a pair of charge reservoirs. The pair of charge reservoirs are connected in series. A first charge movement device induces charge movement to or from the pair of charge reservoirs at a same rate. A second charge movement device induces charge movement to or from one of the pair of reservoirs, the rate of charge movement programmed to one of add or remove charges at a rate proportional to the first charge movement device. The first charge movement device, or other mechanism, loads a first charge into a first of the pair of charge reservoirs during a first cycle. The first charge movement device and the second charge movement device remove charges at a proportional rate from the pair of charge reservoirs during a second cycle until the first of the pair of charge reservoirs is depleted of the first charge.

In accordance with one embodiment, a method of forming a neural network is disclosed. The neural network has n analog multiplier. The analog multiplier has a pair of charge reservoirs, wherein the pair of charge reservoirs are connected in series. A first charge movement device induces charge movement to or from the pair of charge reservoirs at a same rate. A second charge movement device induces charge movement to or from one of the pair of reservoirs, the rate of charge movement programmed to one of add or remove charges at a rate proportional to the first charge movement device. The first charge movement device, or other mechanism, loads an input charge into a first of the pair of charge reservoirs during a first cycle. The first charge movement device a id the second charge movement device remove charges at a proportional rate from the pair of charge reservoirs during a second cycle until the first of the pair of charge reservoirs, is depleted of the input charge. An input gathering device is used as the mechanism to store charge in the first of the pair of reservoirs in conformance with input information.

In accordance with one embodiment, an analog multiplier is disclosed. The analog multiplier has an active pixel comprising a pinned photodiode and a photodetector, wherein input information to the active pixel is stored on a first input charge reservoir. A second charge reservoir is coupled to the first reservoir by a transfer gate positioned between the first charge reservoir and the second charge reservoir, wherein a first rate of charge of movement may be controlled by the transfer gate. A second charge movement device is coupled to the second charge reservoir, wherein a second rate of charge movement may be programmed in proportion to that of the first rate of charge movement. An input charge is loaded into the first charge reservoir only during a first cycle and the transfer gate and the second charge movement device charge proportionally during a second cycle until the first charge reservoir is depleted to produce a charge multiplication on the second charge reservoir at the end of the second cycle.

In accordance with one embodiment, a multiplier is disclosed. The multiplier has a pair of charge reservoirs, wherein each of the pair of charge reservoirs are coupled to a gated charge movement device. The gated charge movement device is programmed so a rate of charge movement is proportional, the gated charge movement device stopping charge movement once one of the pair of charge reservoirs is depleted.

In accordance with another embodiment, a weighted summer is disclosed. The weighted summer consists of a single charge reservoir. A plurality of input current movement devices is coupled to the single charge reservoir where for each of the input current movement devices a rate of current movement conform to weight multiplicands and are proportional to an output charge movement device rate of charge movement. A conduction time of each output charge movement device during a first cycle conforms to an input value. The charge added or removed during the first cycle into the Single charge reservoir represents a weighted sum of the input values. During a second cycle the output charge movement devices will one of add or remove charge to return the single charge reservoir to its original level, a time it takes to return to the original value representing a sum of input value times weighted by rates of movement of the proportional input charge movement devices.

In accordance with one embodiment, a weighted summer is disclosed. The weighted summer one of adds or removes charge from a plurality of weight charge movement devices at a rate proportional to an output charge movement device rate, for a time conforming to input values during a first cycle. An output charge movement device one of adds or removes charge to change a charge level to an original charge level during a second cycle. An output time being a weighted sum representation of input times weighted by the proportional to output charge movement device rates of the weight charge movement devices.

BRIEF DESCRIPTION OF THE DRAWINGS

The present application is further detailed with respect to the following drawings. These figures are not intended to limit the scope of the present application but rather illustrate certain attributes thereof. The same reference numbers will be used throughout the drawings to refer to the same or like parts.

FIGS. 8A-8B illustrates the concept of coupled charge reservoirs coupled together by first charge movement means and a proportional charge movement means proportional to the first coupled only to one of the charge movement means, FIG. 8A shows this configuration using capacitors as charge reservoirs and current sources as charge movements devices and FIG. 8B shows a similar configuration using a pinned photodiode storage well, floating diffusions and transfer gates;

DESCRIPTION OF THE APPLICATION

The description set forth below in connection with the appended drawings is intended as a description of presently preferred embodiments of the disclosure and is not intended to represent the only forms in which the present disclosure may be constructed and/or utilized. The description sets forth the functions and the sequence of steps for constructing and operating the disclosure in connection with the illustrated embodiments. It is to be understood, however, that the same or equivalent functions and sequences may be accomplished by different embodiments that are also intended to be encompassed within the spirit and scope, of this disclosure.

Figure 4:
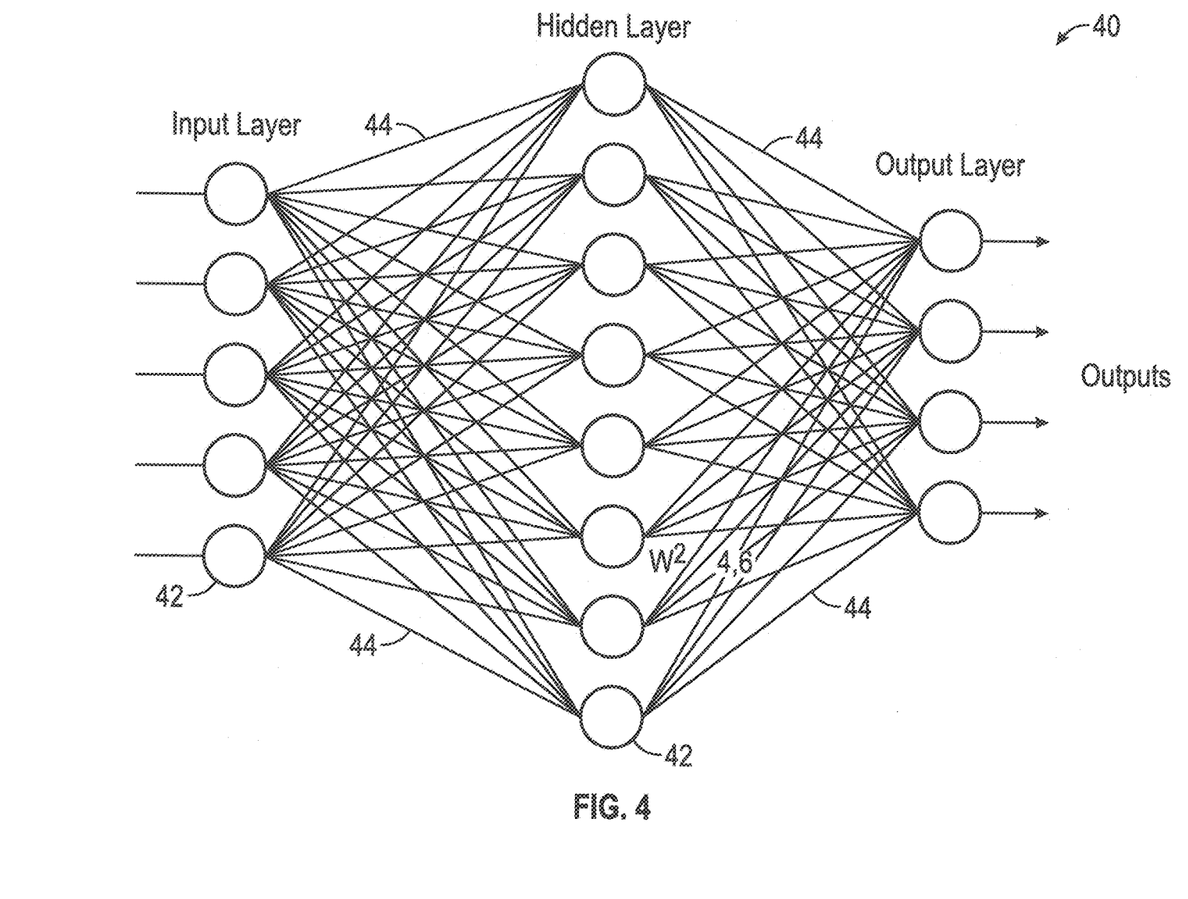
FIG. 4 is a block diagram showing an exemplary embodiment of a neural network architecture forming a basis of the charge domain mathematical engine in accordance with one aspect of the present application.

It is desirable to couple the charge stored in reservoirs directly to the multipliers of the machine learning input layer. Referring to FIG. 4, a block diagram showing a neural network architecture 40 forming the basis of the present application may be seen. In the neural network architecture 40, the circles 42 are neurons or in the case of the input layer the input voltage, charge, current, waveform, or digital word. The lines 44 are multipliers which multiply the input information by a weight (w). The result is fed to a decision circuit and that output in turn is fed to the next layer. As each neuron, containing a summer of weighted inputs potentially a bias and potentially a decision circuit, may be connected to many neurons m the following layers, therefore the number of weights can be very large.

Based on the above, if one could replace the input layer with charge reservoirs such as SW or FD, and utilize this charge within the multipliers connecting this input layer to the first inner layer directly, then one could eliminate the latency, power and information loss due to noise associated with the coupling and digitization circuits.

Figure 5:
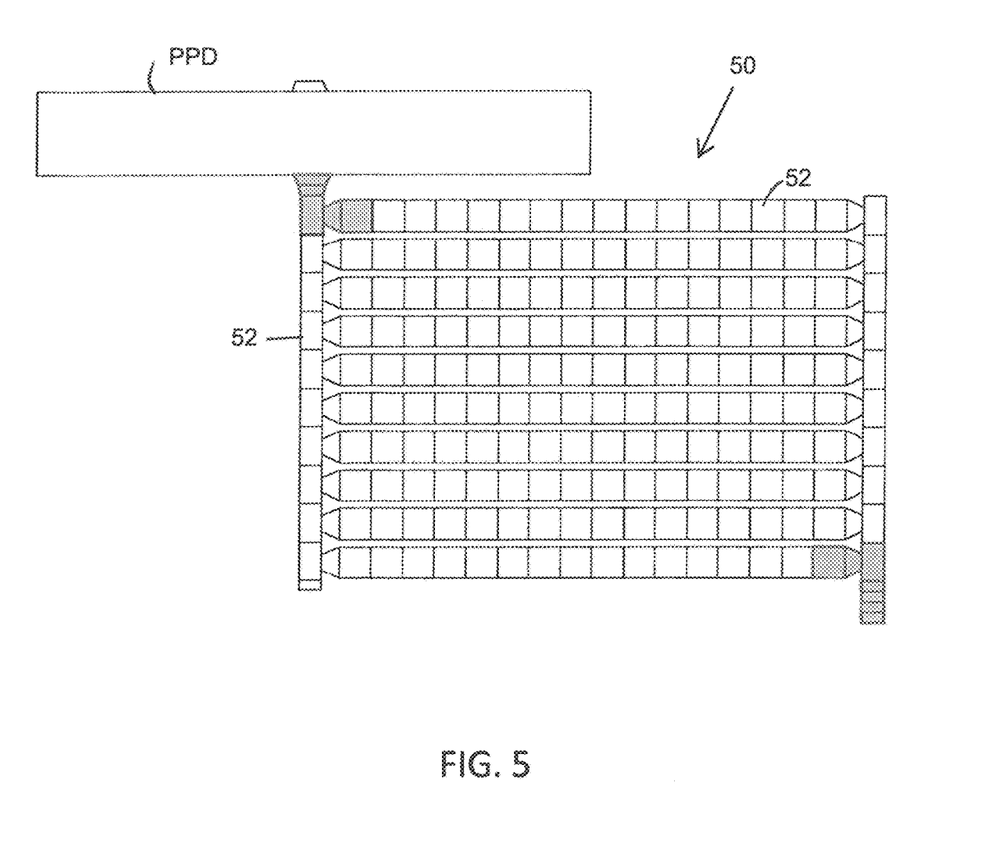
FIG. 5 is block diagram showing air exemplary embodiment of a pinned photodiode (PPD) with a two-dimensional shift register in accordance with one aspect of the present application.
Figure 6A:
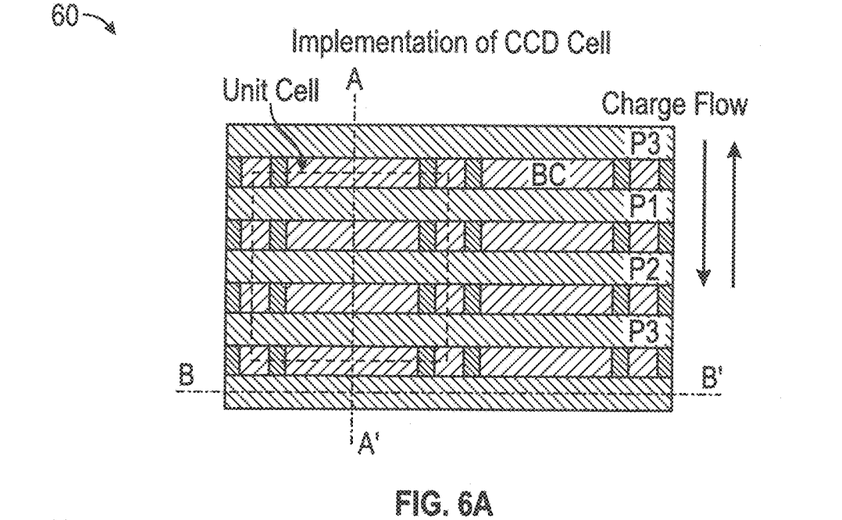
FIG. 6A shows a top level view of a CCD shift register in accordance with one aspect of the present application.
Figure 6B:
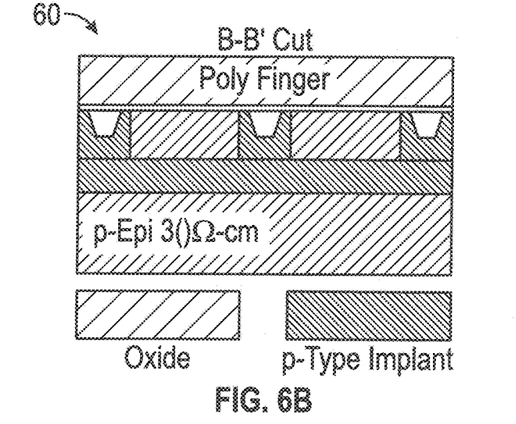
FIG. 6B shows a cross sectional view of, said CCD shift register along the poly finger in accordance with one aspect of the present application.
Figure 6C:
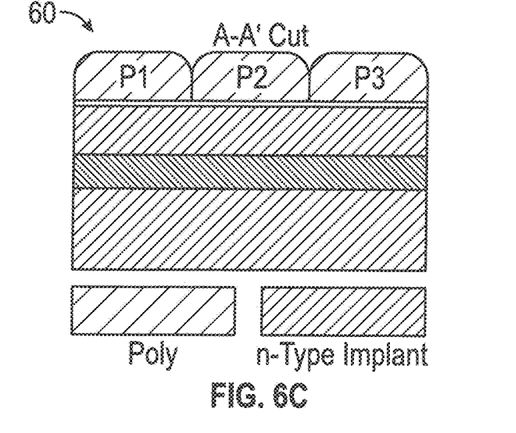
FIG. 6C shows a cross section view of said CCD shift register cutting across the poly fingers in accordance with one aspect of the present application.
Figure 6D:
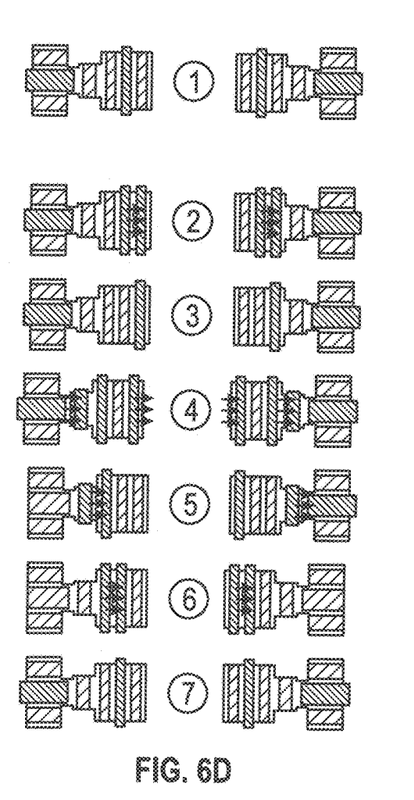
FIG. 6D shows different configurations of CCD shift registers where data may be moving vertically aced then horizontally to alter the flow of information in different directions.

Referring to FIG. 5, once a charge is stored in a reservoir such as SW or PD, it is possible to, store that charge in a charge coupled shift register 50 as shown in FIG. 5. The shift register 50 may be formed of a plurality of cells 52. The shift register 50 may move the charge without loss of fidelity of the charge information. It is also possible to move the charge along multiple axis and to combine charges held within specific reservoirs. Multiple shift registers 50 can also be used to move multiplicand information in different directions and at different speeds.

In FIG. 5, a pinned photodiode (PPD) may be represented by the large rectangle at the top left. It delivers charge through the TG to a charge reservoir. It is possible to keep loading the charges vertically and then move them horizontally based upon the construction of the shift register 50. In this way it is possible to temporarily store charge information, in a small area, with high fidelity. It is also possible to induce a charge in one reservoir to flow into a reservoir with an existing charge to perform summation.

FIG. 6A-6D depict multiple cross-sectional views of a charge coupled device (CCD) shift register 60. The CCD shift register 60 allows for X and Y movement of stored content.

It is common to utilize mathematical constructions to improve the efficiency of multiplies in a machine learning system. For example, in matrix multiplication it is common to move multiplicands through different arrangements such that they may be efficiently re-used without having to re-load the information. Systolic structures are an example which may be used to reduce the number of times multiplicands have to be loaded and which make use of prior calculations. It would be desirable to utilize the charge coupled shift register to organize the charge multiplicands in conformance with these types of mathematical efficiency improvements and in some cases to further utilize the charge coupled shift register to combine the charges for summation.

Figure 7A:
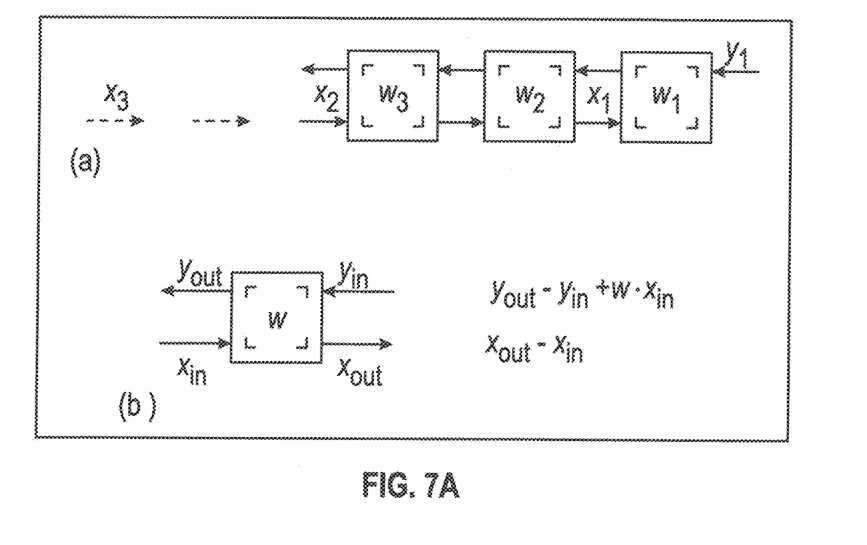
FIGS. 7A-7B shows the concept of systolic rearrangement of multiplication and sum coefficients to illustrate the efficiency that may be gained using the CCD shift register or other means to provide weights and inputs values to the weighted summers of a neural network in optimized ways (re-arrange the provision of the coefficients to the weighted summers) in accordance with one aspect of the present invention.
Figure 7B:
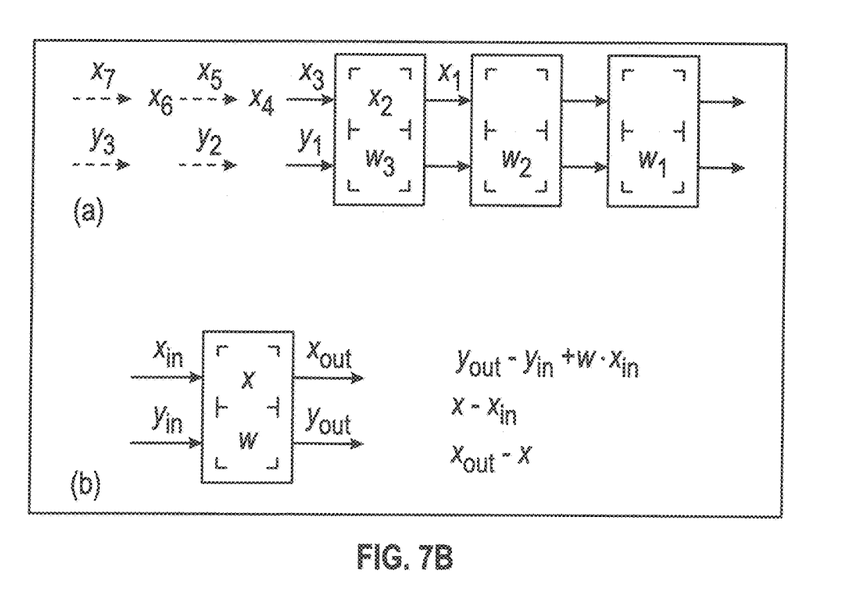

Referring to FIGS. 7A-7B, the concept of a systolic array may be disclosed. Systolic arrays reduce memory loading and organize data into recursive or efficient constructs to increase the efficiency of matrix multiplication. It is useful to implement systolic techniques with CCD shift registers as the operands can easily be moved through the shift register at different speeds and in different directions as required by the different systolic implementations.

Figure 8A:
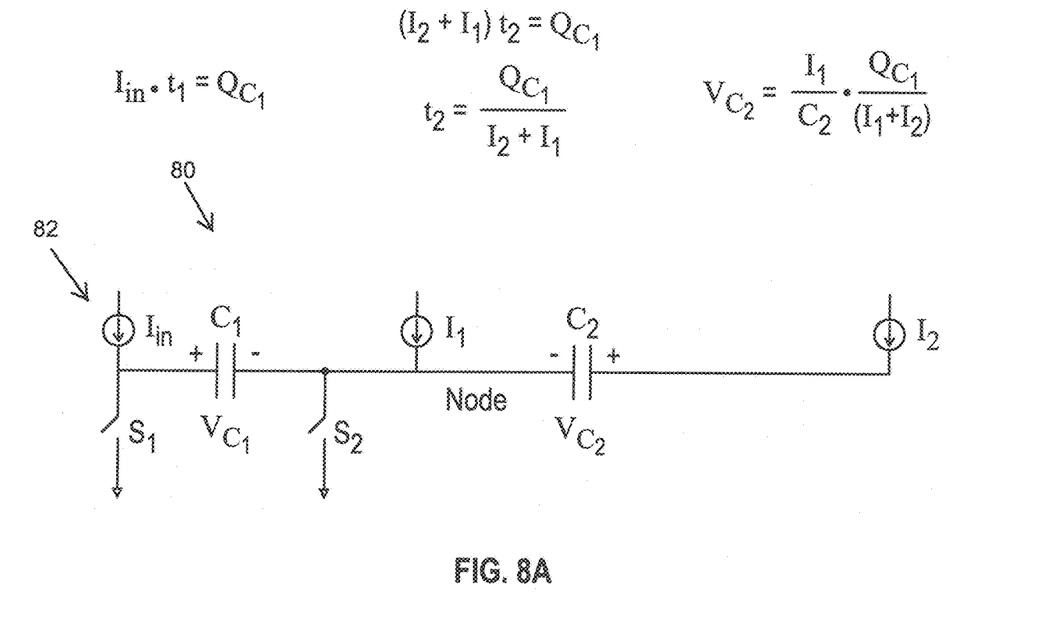
Figure 8B:
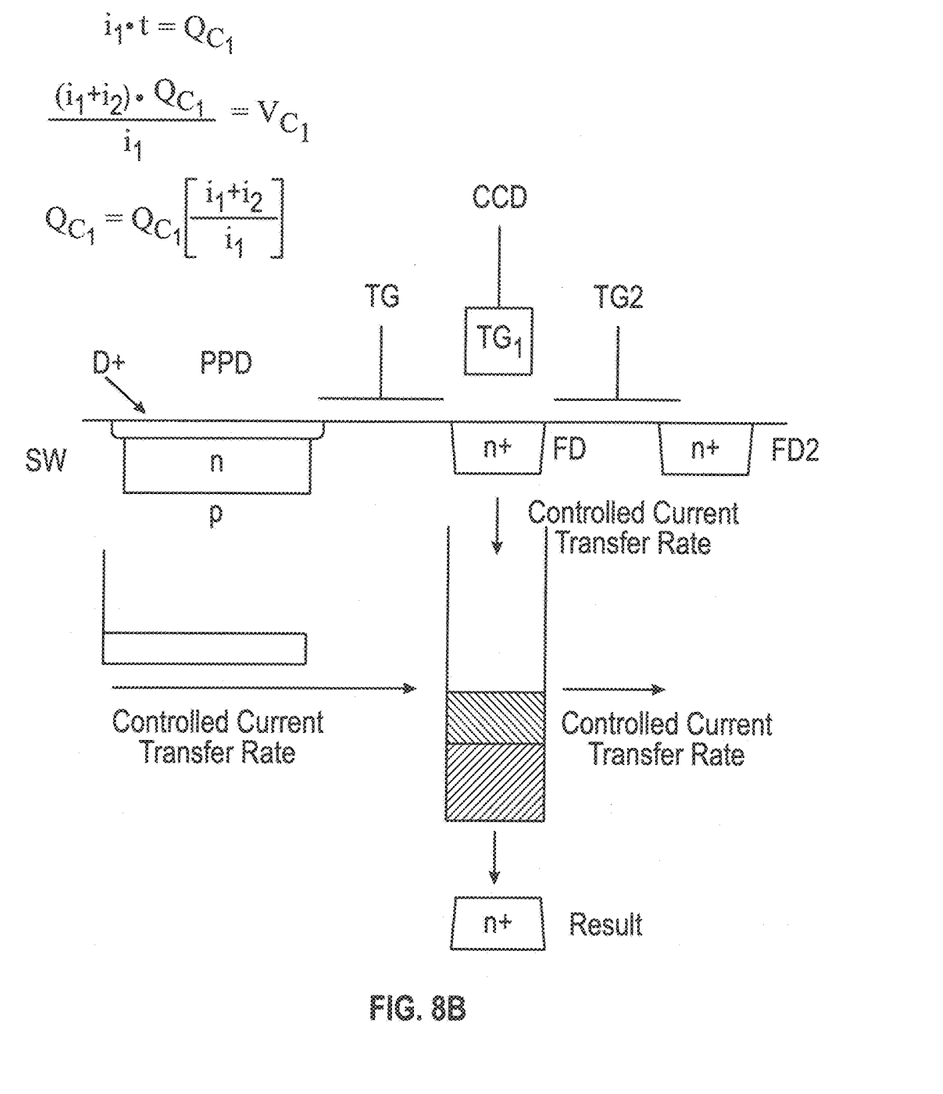

FIGS. 8A-8B shows a charge based analog multiplier in multiple implementations, in FIG. 8A, an implementation 80 where capacitors are used for charge storage is shown where switches S1 and S2 are used to load the input charge reservoir C1 (S1 off, I1 is off, I2 is off, S2 is turned on, current source 82 is tuned on for, a time, switch S2 turned off at the end of this cycle) during a first cycle. In FIG. 8B, a pinned photodiode PPD is shown charging a reservoir SW the same way as the current source 82 and switch S2 charge the C1 by exposing it to light for a time. In both cases the input charge reservoir (C1 in one case and SW in the other) is filled with charge during a first cycle.

In the second cycle S1 in FIG. 8A is closed (S2 being open). The current sources I1 and I2, which are proportional in magnitude, are turned on. C1 is charged by a current magnitude of I1+I2, and C2 is charged by a current magnitude of I2. Node is monitored until the charge on C1 is completely dissipated (voltage across it reaches zero). This takes Qc1/(I1+I2) time where Qc1 was the charge introduced on C1 during the first cycle. C2 is charged by I2 only for this Qc1/(I1+I2) time which means it will see a charge of I2*Qc1/(I1+I2). This means it will receive the charge C1 multiplied by the ratio of I2/(I1+I2). By controlling I2/(I1+I2) one has set a multiplier gain.

In an analogous way, in FIG. 8B, the charge, on the pinned photodiode PPD may be moved by a field into the floating diffusion FD at a rate controlled by the TG path. A second charge path through the TG1 also fills the FD at a rate proportional to the rate of charge movement from SW. The time it takes to deplete SW is Qc1/i1=t. A current i1+i2, is flowing into FD for a time t, therefore Qc1*(i1+i2)/i1 is the charge on FD. Thus, one has effectively multiplied the charge by (i1+i2)/i1. Instead of a pinned photodiode a CCD array or other floating diffusion could be the source of i1. FD may them be read into voltage or current by a coupling circuit or may be used for further calculation.

By coupling the output of the PPD multiplier to a CCD shift register, a two dimensional CCD shift register or a second CCD shift register may be used to sum charges as if they were entering a neuron. If a systolic architecture is used then the charge reservoirs may be coupled to appropriate operands as they move through the CCD array and the results may be summed into the input reservoir of a multiplier or the result could be re-injected into another shift register cell for re-use. For broadcast topologies the CCD shift register may be used to create multiple copies of an input to load an x operand into multiple multipliers.

It would therefore be useful to store multiplicands in one or more CCD arrays and then move the information through the arrays in conformance with systolic arrangements so as to minimize memory loading and multiplier efficiency.

Figure 9:
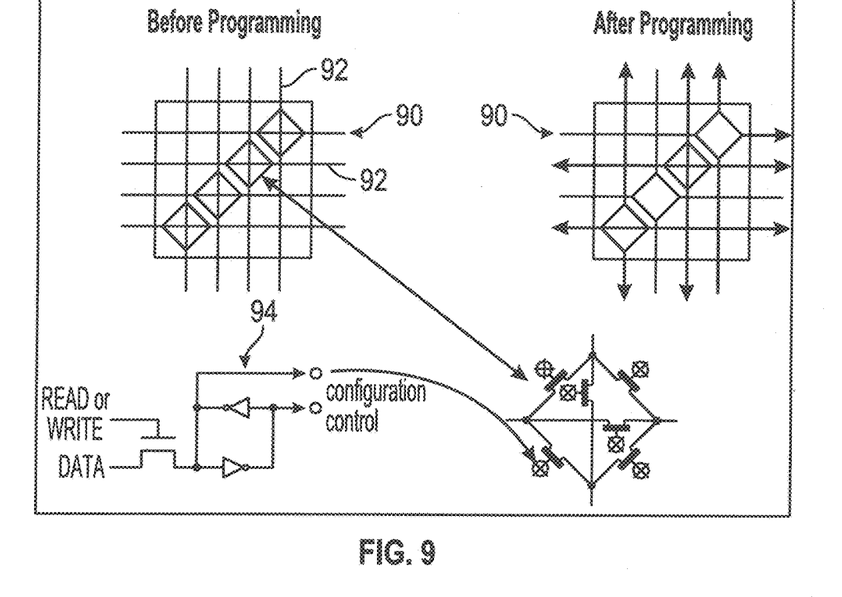
FIG. 9 shows a crossbar that might be used to couple pulses or current source weights through switch fabric.

It would be useful to allow the loading of multiple inputs into said first reservoir at the same time. This may be accomplished by summing a known charge from multiple weighted inputs, such as the outputs of multiple neurons from a previous layer, into said first multiplier reservoir. FIG. 9 shows the concept of a crossbar 90. The crossbar 90 is an assembly of individual switches between a set of inputs and a set of outputs. The switches may be arranged in a matrix. If the time weighted crossbar 90 has M inputs and N outputs, then the crossbar has a matrix with M×N crosspoints or places where the connections cross. At each cross-point is a switch; when closed, it connects one of the inputs to one of the outputs. A given crossbar is a single layer, non-blocking switch. Non-blocking switch means that other concurrent connections do not prevent connecting other inputs to other outputs. As may be seen in FIG. 9, metal lines 92 come together and switches between them may be turned on to connect lines together on different layers or the same layers of metal or other conductor. Several crossbars can produce a significant fanout. A gated current source 94 may be coupled through such an arrangement.

Figure 10:
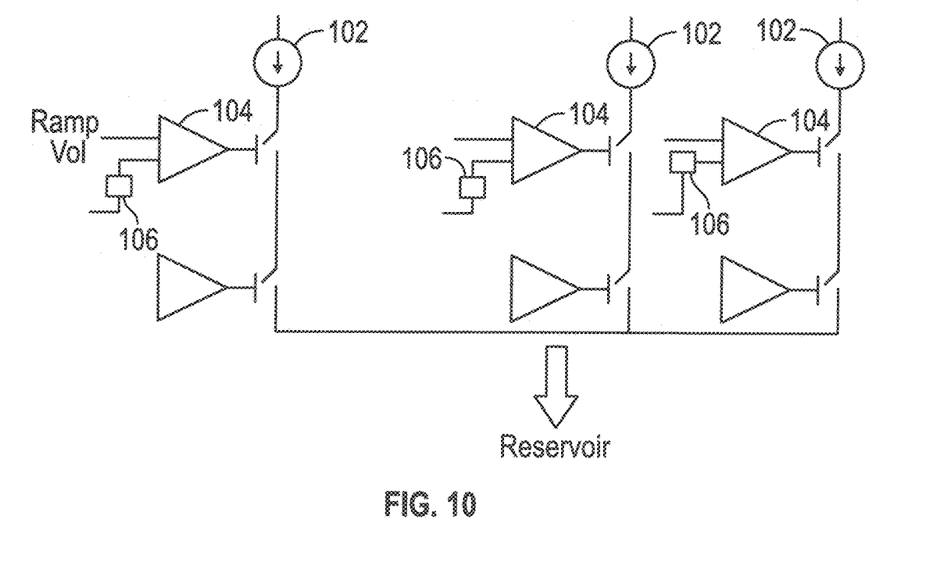
FIG. 10 shows a time weighted crossbar that can sum a weighted charge to an output ode and also shift the summing of such a charge over several frames in time.

It would be useful to allow the loading of multiple inputs into said first reservoir at the same time. This may be accomplished by summing a known charge from multiple weighted inputs, such as the weighted outputs of multiple neurons from a previous layer, into said first multiplier reservoir. FIG. 10 shows one possible configuration of a time weighted crossbar 100, however, for now assume the second row of switches is closed. In this case connected paths are further coupled to current sources 102 of the same magnitude. Paths do not start charging until a stored voltage, such as an NVM voltage, matches a ramp voltage as determined by comparators 104. This produces a charge proportional to the stored voltage since the currents are proportional and ramp are generated from the same source. These currents may be injected into a floating diffusion or optically coupled into a diffusion or used directly if capacitors or other storage elements are used for the multiplier. This time delay crossbar 100 may be addressed using relative or direct addressing and allows flexible neural network configurations even though the neurons have a specific physical location. The result is that the weights are set by current magnitudes and input values by time. For subsequent layers, or layers with charge inputs such as PPD inputs, the output of each weighted summer can be time and therefore the comparators 104 are not necessary—the output of previous neurons can be applied directly to gate the switches.

Current magnitudes may come from a dynamic or from an NVM memory. This may be an analog memory such as a ferroelectric memristor. It could be an analog floating gate or flash memory. Or it could be a DNA memory. DNA memory has recently shown great promise in producing analog or digital memory in a very small area like 3 nm with a very long lifetime. Ferroelectric memristors such as those developed by Panasonic have been shown capable of producing accurate analog values.

Neuromorphic spiking networks are energy efficient because they only turn on neural, pathways when the controlling neuron weighted input summer reaches a threshold, leaving neurons which do not accumulate sufficient input charge unused. It would be useful to modify the weighted summer described in this application to allow such an implementation when said weighted summer is used to create a neuron. This can be done by coupling a comparator to the first/input charge reservoir and once the charge on this reservoir reaches a level an interrupt is generated forcing the controller to couple the output of the neuron to its appropriate connection within the desired neural network. Some neuromorphic spiking networks also have the retirement for magnitude and/or time delay information. Time delay may be introduced through repeating the ramp in the time delay crossbar multiple times and through the use of a second set of switches 106 in FIG. 10. For example if the ramp were repeated five times and a controller provided a five bit word indicating on which ramp the current should be applied then a simple counter could be used to determine when to turn on said second switch to implement said time delay by only allowing current to flow if it matches the appropriate five (5) bit delay word.

In certain cases it may be more efficient to separate the charge reservoirs completely rather than coupling them in series. In this ease the first charge reservoir charges during, a first cycle and during a second cycle is discharged by a charge movement means at a controlled rate until it is depleted. During this same second cycle a second charge movement means, programmed to be of proportional magnitude to that charging the first, charges the second charge reservoir until the charge on the first charge reservoir is depleted. Now the charge on the second charge reservoir will be that of the first multiplied by the ratio of the rates of charge movement. For example if the charge movement means were current sources, and I1 were depleting the first charge reservoir and I2 charging the second, then the charge on said second charge reservoir at the end of the seed cycle would be I2/I1*Q1 where Q1 is the initial charge on the first charge reservoir. The charge movement means could be a MOSFET transfer gate, a graded junctions or other devices capable of controlling charge while also being started or stopped.

Figure 11:
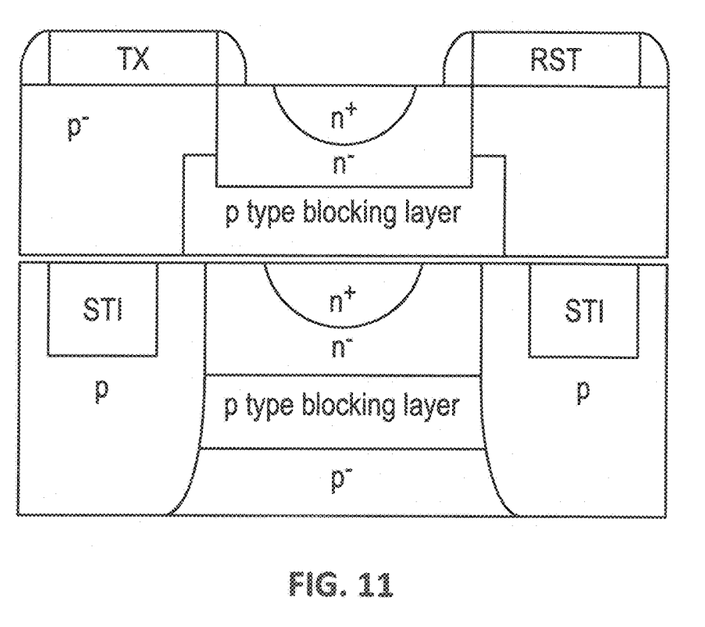
FIG. 11 shows a depleted junction transfer gate that could be used to reduce charge injection for switching devices or reduce ringing in current sources.

To reduce charge injection and allow use of extremely small equivalent capacitances, the transfer gates are created with depleted junction MOSFETs whose construction is also designed to minimize overlap capacitance. An example is shown in FIG. 11.

Figure 12:
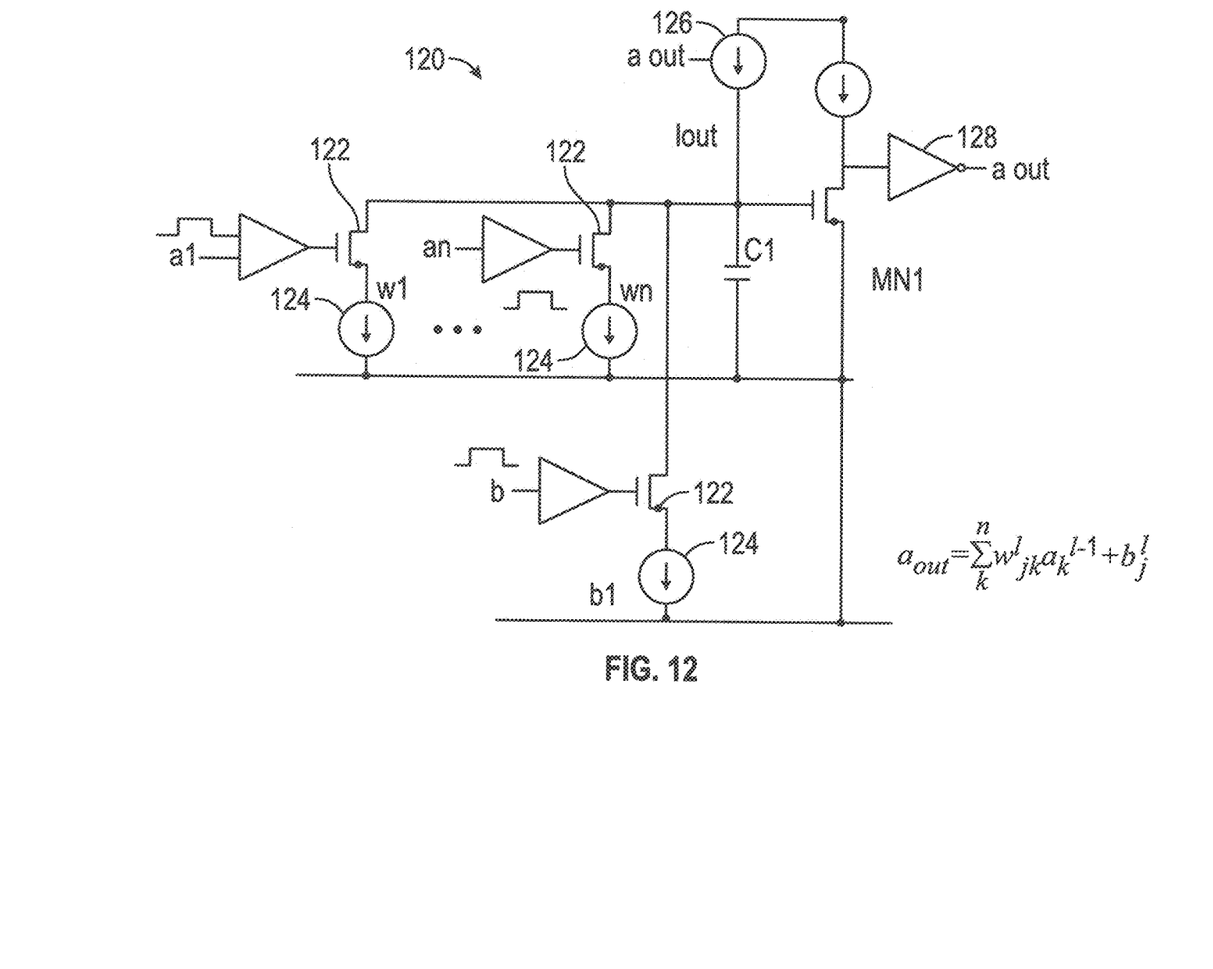
FIG. 12 is a block diagram showing an exemplary embodiment of a weighted summer with a pulse output in accordance with one aspect of the present application.

Referring to FIG. 12 an embodiment showing weighted summer 120 may be considered. Here a single charge reservoir is shown consisting of the gate of MN1 which is also connected to C1 (which could be a capacitor or floating diffusion), the drain of the gating MOSFETs 122 and current source 126 also known as Iout. Charge movement device 124 labelled w1 and wn and bias b1 are programmed in conformance with desired weight inputs and in proportion to current source Iout 126. These weight inputs are gated by time inputs a1, an, and b which are shown connected to a buffer driving the gates of MOSFETs 122. During a reset the gate of MN1 is pulled below its Vt comparator threshold, which will cause the drain of MOSFET M1 to invert and allow inverter 128 to turn on current source 126 until the MN1 gate reaches its switching threshold after which it is switched off. In a first cycle, the time plurality of pulse inputs a1 . . . an and b effectively allow the weights to flow for a given amount of time resulting in a weighted charge to be removed from the charge reservoir at the gate of MN1. Once this current is removed MN1's drain will again flip its state and cause the inverter 128 to turn on the current source Iout which will replace the charge removed by the weighted inputs. The time it takes to do so will represent a weighted sum output pulse at aout.

While embodiments of the disclosure have been described in terms of various specific embodiments, those skilled in the art will recognize that the embodiments of the disclosure may be practiced with modifications within the spirit and scope of the claims

What is claimed is:

1. A weighted summer comprising:
a single charge reservoir;
a plurality of input charge movement devices each coupled to the single charge reservoir, each one of coupling or removing charges to or from the single charge reservoir in a first cycle, wherein for each of the input charge movement devices a rate of charge movement conforms to weighted multiplicands and are proportional to an output charge movement device rate of charge movement; and
an output charge movement device one of coupling or removing the charges to or from the single charge reservoir so as to return the single charge reservoir to a starting charge level during a second cycle after which charge movement ends.

2. The weighted summer of claim 1 wherein:
the plurality of input charge movement devices couple or remove the charges at rates proportional to the rate that the output charge movement device will couple or remove the charges during the second cycle, but where the plurality of input charge movement devices are each individually gated in time in conformance with input information and;
wherein during the second cycle a time during which the output charge movement device is coupling or removing the charges to return the single charge reservoir to the starting charge level represents an output of the weighted summer.

3. The weighted summer of claim 1, wherein the summer comprises a spiking circuit having a comparator, the comparator initiating an interrupt to a controller circuit when the single charge reservoir reaches a predetermined level.

* * * * *